United States Patent
Senkevich et al.

(10) Patent No.: US 7,501,154 B2
(45) Date of Patent: Mar. 10, 2009

(54) SURFACE MODIFICATION OF CVD POLYMER FILMS

(75) Inventors: John Joseph Senkevich, Rolla, MO (US); Toh-Ming Lu, Loudonville, NY (US); Guangrong Yang, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 180 days.

(21) Appl. No.: 11/061,853

(22) Filed: Feb. 18, 2005

(65) Prior Publication Data

US 2005/0227055 A1    Oct. 13, 2005

Related U.S. Application Data

(63) Continuation of application No. PCT/US03/25912, filed on Aug. 19, 2003.

(51) Int. Cl.
*C23C 16/00* (2006.01)
*B32B 15/08* (2006.01)

(52) U.S. Cl. .............. 427/255.28; 427/248.1; 427/255.6; 427/255.7; 428/332; 428/336; 428/457

(58) Field of Classification Search .......... None
See application file for complete search history.

(56) References Cited

U.S. PATENT DOCUMENTS 3,375,419 A * 3/1968 Westbrook et al. .......... 257/410
4,123,308 A * 10/1978 Nowlin et al. .............. 427/536
4,225,647 A * 9/1980 Parent ........................ 428/336
5,137,780 A * 8/1992 Nichols et al. .............. 428/336
6,358,863 B1   3/2002 Desu et al. .................. 438/763

OTHER PUBLICATIONS

"Thickness Effects in Ultrathin Film Chemical Vapor Deposition Polymers", Jay J. Senkevich, J. Vac. Sci. Technol. A 18(5), vol. 18, No. 5, Sep./Oct. 2000, pp. 2586-2590, XP-002273895.

"Wafer Bonding Using Dieclectric Polymer Thin Films in 3D Integration", Y. Kwon, et al, Mat. Res. Soc. Symp. Proc., vol. 710, pp. 231-236, XP008028699.

* cited by examiner

*Primary Examiner*—Monique R Jackson
(74) *Attorney, Agent, or Firm*—Heslin Rothenberg Farley & Mesiti P.C.

(57) ABSTRACT

The present invention relates to a method for forming a conformal coating having a reactive surface. In the method, an ultrathin layer composed of a polymer having repeating units derived from unsubstituted p-xylylene, substituted p-xylylene, phenylene vinylene, phenylene ethynylene, 1,4-methylene naphthalene, 2,6-methylene naphthalene, 1,4-vinylene naphthalene, 2,6-vinylene naphthalene, 1,4-ethynylene naphthalene, 2,6-ethynylene naphthalene, combinations thereof, precursors therefor or combinations of precursors therefor, is deposited on a substrate by a thermal CVD process. The ultrathin layer is optionally exposed to a source of oxygen and then exposed to a reagent selected from ammonium hydroxide, tetramethylammonium hydroxide, ammonium sulfide, dimethyl sulfide, thioacetic acid, sodium hydrosulfide, sodium sulfide, hydrazine, acetamide and combinations thereof. The surface may be modified readily after the treatment.

4 Claims, 1 Drawing Sheet

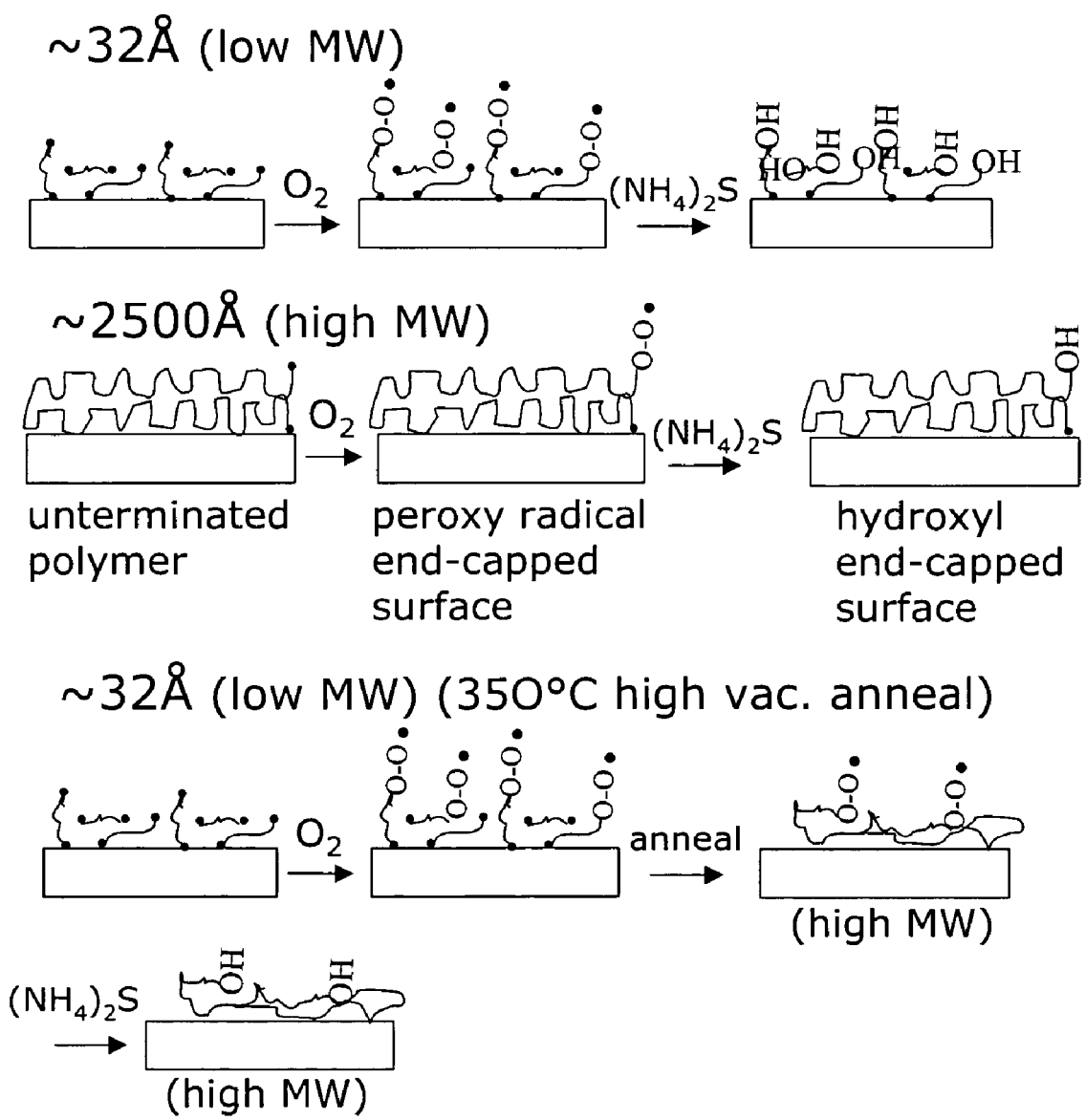

SURFACE MODIFICATION OF CVD POLYMER FILMS

RELATED APPLICATIONS

This application is a continuation of International Application No. PCT/US/03/25912, filed on Aug. 19, 2003, which claims priority from U.S. provisional application Ser. No. 60/404,488, filed Aug. 19, 2002. The entire disclosure of both applications is incorporated herein by reference.

BACKGROUND OF THE INVENTION

Parylene is a generic name for a family of poly-p-xylylene polymers which may be deposited by CVD and polymerize by a free-radical mechanism that is self-initiating and non-terminating. The unterminated chain endings allow for unique chemistry to take place post-deposition. The monomer is typically generated by pyrolysis from a cyclophane or halogenated precursor.

The simplest commonly available polymer is parylene-N in which all carbon atoms are unsubstituted. Many other versions exist in which one or more of the carbon atoms are substituted with chlorine, fluorine or cyano groups, including parylene C, parylene D, parylene AF4, and cyanoparylene. Parylene polymers have a low dielectric constant (in the range of 2.3 to 2.6, e.g. AF-4 is 2.24 at 1 MHz out of plane) and have been tested as an interlayer dielectric in the fabrication of integrated circuits. Coating of parylene on wafers and other substances is known in the art. (See, for example, Plano et. al. Mat. Res. Soc. Symp. Proc. Vol. 476, pp. 231 (1997), Olson et. al. U.S. Pat. No. 5,709,753 and references cited therein).

Parylene coatings are typically obtained from sublimation of the cyclophane precursor followed by pyrolysis which forms the reactive intermediate, as shown in Scheme 1 for parylene N. The monomer in the vapor phase is fed into a deposition chamber where the monomer deposits on the surface of the substrate to be coated. Polymerization occurs at the surface, forming the parylene film.

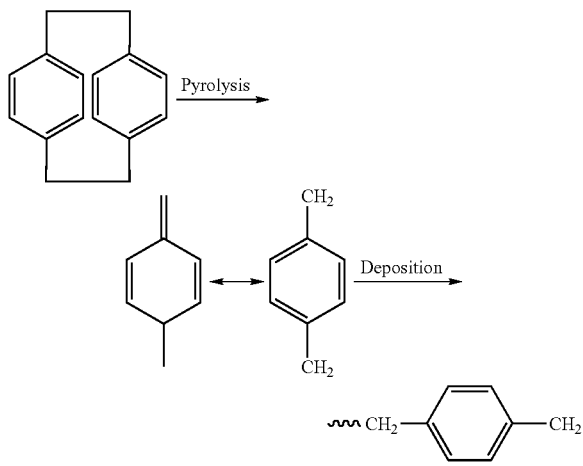

SCHEME 1

Polymeric surfaces are notoriously hard to metallize and adhere to since they are relatively inert, possessing few surface reactive groups and a low surface free energy. To improve polymer metallization and polymer-polymer adhesion a myriad of processes have been developed to functionalize polymeric surfaces. These processes may be grouped as either dry, e.g. in a vacuum system, or solution-borne, as in with the use of wet chemistry. The dry methods typically use an arc discharge (capacitively coupled plasma) or a microwave plasma with various chemistries, i.e. $H_2O$, $O_2$, $N_2$, $N_2O$, $NH_3$ and $H_2S$. Surface modification of polymer surfaces has also been undertaken in vacuum by flowing $H_2O$ over a hot filament and by an $Ar^+$ irradiation method.

Solution-borne processes typically use aggressive oxidizing reagents such as $H_2CrO_4+H_2SO_4$, $KClO_3+H_2SO_4$, $H_2CrO_4$, fuming $H_2SO_4$, solvated electrons e.g. low temperature $Mg/NH_3$, $KMnO_4$, $OsO_4$, $NH_3+AlCl_3$, or $HNO_3+H_2SO_4$. The primary drawback of the solution-borne and the dry methods is their tendency to modify, not only the polymer surface, but also the underlying polymer subsurface and often inducing bond cleavage.

Accordingly, there is a need for gentle methods to improve metallization of the polymer substrate and/or adhesion between the polymer substrate and a higher energy surface or the surface of another polymer film.

SUMMARY OF THE INVENTION

It has been unexpectedly discovered that depositing an ultrathin polymer layer on a substrate by a thermal CVD process, and exposing the layer to oxygen yields a reaction surface that may be readily functionalized and bonds readily to metal or polymeric surfaces. Accordingly, in one aspect, the present invention relates to a method for forming a conformal coating having a reactive surface, wherein an ultrathin layer composed of a polymer having repeating units derived from unsubstituted p-xylylene, substituted p-xylylene, phenylene vinylene, phenylene ethynylene, 1,4-methylene naphthalene, 2,6-methylene naphthalene, 1,4-vinylene naphthalene, 2,6-vinylene naphthalene, 1,4-ethynylene naphthalene, 2,6-ethynylene naphthalene, combinations thereof, precursors therefor or combinations of precursors therefor is deposited on a substrate. In a second step, the ultrathin layer may be exposed a source of oxygen to passivate the surface thereof.

BRIEF DESCRIPTION OF THE DRAWINGS

FIG. 1 is a schematic diagram comparing reactive chain ends of thick polymer films with those of ultrathin oligomer films.

DETAILED DESCRIPTION OF THE INVENTION

The present invention relates to methods for depositing conformal coatings having a reactive surface. The method includes depositing on a substrate by a thermal CVD process an ultrathin polymer layer. In the context of the present invention, an ultrathin layer or film is defined as one having a thickness of less than 500 Å, preferably less than 200 Å, more preferably, less than 100 Å and most preferably, less than 50 Å. A thick layer or film is defined as one having a thickness greater than 1000 Å. The ultrathin layer has a relatively high concentration of chain ends, in contrast to a thick polymer layer, which has relatively fewer chain ends. This is illustrated in FIG. 1, which shows schematically the difference between an ultrathin layer and a thick layer. Thick polymer films, which may have molecular weight in the range of 10,000-20,000 Daltons, have few reactive species at the surface, while very thin films of similar composition have many chain endings at the surface since they are only a few repeat units long. The chain endings are free groups, and can react with a variety of species to yield a surface-modified film. Thick films of polymers such as parylene typically cannot be easily modified since few chain ends exist at the surface; however, this is in contrast to ultrathin films composed of the same repeating units, which are readily modified.

The polymer of the ultrathin layer is composed of repeating units derived from substituted and unsubstituted p-xylylenes (from cyclophane or halogenated precursors), phenylene vinylene, phenylene ethynylene, 1,4-methylene naphthalene, 2,6-methylene naphthalene, 1,4-vinylene naphthalene, 2,6-vinylene naphthalene, 1,4-ethynylene naphthalene, 2,6-ethynylene naphthalene, precursors therefor, and combinations thereof. Substituents for the p-xylylenes include halo, mercapto, hydroxy, alkoxy, primary, secondary or tertiary amino, vinyl, ethynyl and cyano groups, and any or all of the carbon atoms in the phenyl or in the side chain may be substituted. Ultrathin parylene polymers such as Parylene N, Parylene C, Parylene D, Parylene AF4, and Parylene VT4 are preferred, particularly Parylene N. It should be noted that these ultrathin parylene polymer films are believed to have very low molecular weight compared to parylene films having a thickness greater than 1000 Å. Examples of repeating units that make up the ultrathin polymers or oligomers for use in the present invention include:

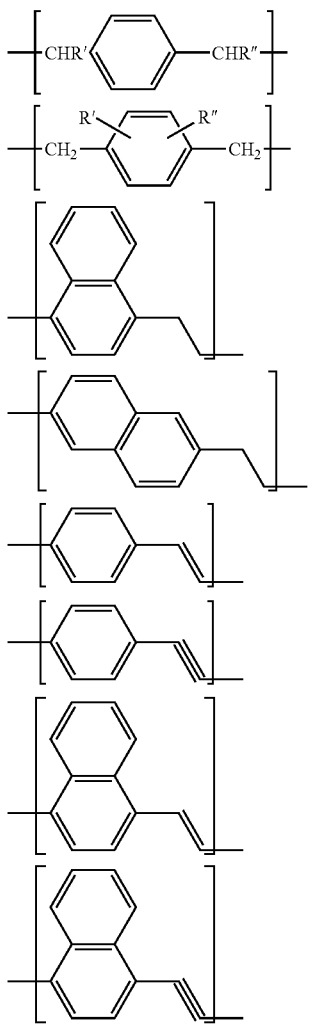

-continued

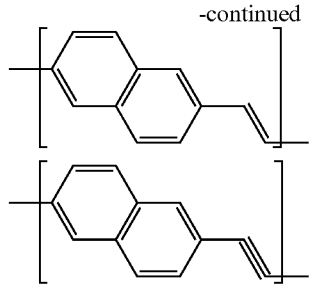

wherein R' and R'' are independently hydrogen, halo, mercapto, hydroxy, alkoxy, primary, secondary or tertiary amino, vinyl, ethynyl or cyano.

In one embodiment of the invention, the surface of an ultrathin layer or film of the polymer, vacuum deposited on a substrate by a thermal CVD process, is modified by contacting it with a material that reacts with the free radical chain ends. In particular, the surface may be exposed to oxygen, whereby oxygen is bound to the surface to form an oxygen-passivated film. This may be accomplished by releasing the vacuum in the reactor after deposition of the ultrathin layer, or by supplying oxygen through the reactor delivery system. It is believed that the oxygen bound to the surface is in the form of peroxy radicals attached to the chain ends. Oxygen passivation may promote interaction between the surface of the ultrathin layer and a second surface or a second layer deposited thereon Substrates for use in the present invention include thick polymer films, metals including but not limited to stainless steel, dielectrics and semiconductors. Polymers for use in thick films may have the same repeating unit composition as the ultrathin layer, or the composition may be different. Parylenes, including Parylene N, Parylene C, Parylene D, Parylene AF4, and Parylene VT4, poly(1,4-methylene naphthalene), poly(2,6-methylene naphthalene) and conjugated polymers including poly-phenylene vinylene, poly-phenylene ethynylene, poly-1,4-vinylene naphthalene, poly-2,6-vinylene naphthalene, poly-1,4-ethynylene naphthalene, and poly-2,6-ethynylene naphthalene may be used. Parylenes are preferred substrates, particularly Parylene N. Si-containing semiconductor materials such as Si, SiGe, and silicon-on-insulators; conductive metals such as Cu, Al, W, Pt, Ag, Au and alloys or multilayers thereof; copper barrier materials such as silicon nitride or amorphous silicon carbide materials which may (or may not) also contain nitrogen; and interconnect levels of an interconnect structure may also be used. When the substrate is an interconnect level, the substrate may be composed of any conventional inorganic, e.g., $SiO_2$ or perovskite-type oxide, or organic, e.g., polyimide, dielectric material and it may contain conductive metal lines or vias therein. When the substrate is an interconnect level of an IC structure, it may be fabricated using conventional techniques, including damascene, dual damascene and non-damascene such as metal etch processes that are well known to those skilled in the art. Since the fabrication of interconnect structures is well known and is not critical to the present invention, a detailed discussion regarding the same is not provided herein.

The ultrathin layer may be deposited by conventional methods used for deposition of parylene or conjugated polymers. Deposition time, temperature, pressure and/or precursor flow rate may be adjusted to result in a layer of the desired thickness.

In one embodiment of the invention, the surface of the oxygen-passivated film is further modified by exposing it to a reagent such as ammonium hydroxide, tetramethylammonium hydroxide, ammonium sulfide, dimethyl sulfide, thioacetic acid, sodium hydrosulfide, sodium sulfide, hydrazine or acetamide. By this technique, hydrophilic functionality such as hydroxyl groups (from ammonium hydroxide, tetramethylammonium hydroxide, or ammonium sulfide), mercapto groups (dimethyl sulfide, thioacetic acid, sodium hydrosulfide, or sodium sulfide) or amino groups (from hydrazine or acetamide) may be attached to the surface of the film. Ammonium sulfide is a preferred reagent for attachment of hydroxyl functionality. It is anticipated that the modified surface would be reactive with a variety of other materials, including biomolecules, dielectrics or metals.

In another embodiment, the oxygen-passivated film is used without further modification as a metallization substrate to form a metallized dielectric having superior integrity and adhesion between the polymer and the metal layer. In this case, the substrate upon which the ultrathin layer is deposited is a thick polymer film or other dielectric. The metal layer may be bound to the ultrathin film via metal alkoxide bonds between the metal and the oxygen atoms at the surface of the film. Metals that may be used are those for which the heat of formation or reduction potential of the metal oxide is large and negative, including Be, B, Mg, Al, Si, Ti, V, Cr, Mn, Fe, Co, Ni, Zr, Nb, and Ta, particularly Al, Ti, Cr, and Ta. While adhesion between a polymer dielectric and a metal overlayer is typically facilitated by plasma or ion treatment, this is not necessary when using the methods of the present invention.

In yet another embodiment, an ultrathin polymer layer may be used as a bonding layer between multilayer structures for 3-D integrated circuits. In this embodiment, an ultrathin layer of an polymer is deposited on each of the individual structures for assembly into the multilayer. If desired, the ultrathin films may be exposed to oxygen. The opposing ultrathin layers are then brought together under heat and/or pressure to form the bonded multilayer structure.

In any of the embodiments of the invention, the substrate on which the ultrathin film is deposited may be a thick polymer layer or film, especially a parylene polymer. In this way, the surface of a parylene layer may be modified. In this way, biomolecules, for example, may be attached thereto. In addition, adhesion between two such polymer layers or between a polymer layer and a layer composed of a chemically dissimilar material, such as metal or a dielectric may be thereby enhanced. Factors that improve adhesion also facilitate metal deposition on surface-modified oligomer or polymer layers.

Experimental

The vacuum deposition system used to deposit poly(p-xylylene) (PPXN) and poly(chloro-p-xylylene) (PPXC) from their respective cyclophane precursors has been explained in detail before (J. B. Fortin and T.-M. Lu, J. Vac. Sci. Technol. A, 18 (2000) 2459).

The PPXC ultrathin films were deposited for 2.75 min onto RCA-1 cleaned (5:1:1 DI-$H_2O$:$NH_4OH$:$H_2O_2$ at 70° C. for 2 min) native oxide on Si (50 Ω-cm) or thick PPXN films deposited previously. The base pressure of the vacuum system was <$10^{-6}$ Torr and the pressure of deposition was 0.250-0.270 mTorr. These conditions yielded a 15.1 Å PPXC film with a native oxide thickness of 14.0±1.0 Å. The PPXN thin films were deposited at 1.00-1.09 mTorr for 2.75 min yielding 32.6±0.5 Å thick films. The thick PPXN films were deposited at 5.0 mTorr for 20 and 35 min yielding thickness of 2519±10 Å and 4752±7 Å. The pyrolysis chamber for 'cracking' the cyclophane was kept at 650° C. and the sublimator temperatures were kept at 140° C. and 125° C. for the PPXN and PPXC dimers.

The thicknesses of the ultrathin parylene films were determined using a Variable Angle Spectroscopic Ellipsometry (VASE) (M-44, J.A. Woollam Co., Lincoln, Neb.) at three angles 75, 76, and 77° to the sample normal. The ultrathin films grown on the native oxide were characterized by the same method as the native oxide itself. However, instead of just $SiO_2$/Si(Jellison) another layer was added to the model to fit for the ultrathin films. The isotropic Cauchy model was used for the ultrathin PPXC and PPXN films assuming Cauchy parameters of $A_n$=1.62, $B_n$=0.01, and $C_n$=0 yielding an index of refraction of 1.645 at 634.1 nm.

$$n(\lambda)=A_n+B_n/\lambda^2+C_n/\lambda^4 \text{ (Isotropic Cauchy Model)} \quad (1)$$

For the thicker films, >50 Å, an anisotropic Cauchy model was used since PPXN and PPXC both exhibit optical birefringence and three angles 65, 70, and 75° to the sample normal were used. The thick PPXN film used for XPS analysis was 4752±7 Å with indices of refraction of $n_{in\text{-}plane}$=1.6569±0.0005 and $n_{out\text{-}of\text{-}plane}$=1.5999 ±0.0005. The thick PPXN film used for contact angle measurements was 2519±10 Å with indices of refraction of $n_{in\text{-}plane}$=1.6682±0.0005 and $n_{out\text{-}of\text{-}plane}$=1.6042±0.0003. The ultrathin PPXN films used for contact angle measurements were 32.3-33.1 Å. After a 350° C. anneal for 60 min at <$10^{-6}$ Torr in a quartz furnace the films were 24.1-26.8 Å.

A custom-built contact angle goniometer was used to measure the equilibrium contact angles of the hydroxyl functionalized PPXN surfaces (50 wt % ammonium sulfide Aldrich, Milwaukee, Wis.). The polymer thin films were placed in borosilicate beakers and sealed with Parafilm™. After 5, 15, or 30 min the samples were removed and washed with DI-$H_2O$ (18 MΩ⁻-cm) and blown dry with nitrogen. The equilibrium contact angles were measured by the method of Good by use of the sessile drop technique (R. J. Good, in R. J. Good and R. R. Stromberg, (Eds.), Surface and Colloid Science, Vol. 11, Plenum, New York, 1979). All the contact angles measured in this study were undertaken with DI-$H_2O$ with an accuracy of ±2° and a drop volume of 5 μL.

A Perkin-Elmer 5500 with a Mg Kα (1.253 keV) source was used for X-ray Photoelectron Spectroscopic characterization of the PPXC and PPXN films. The X-ray beam diameter was 1.5 mm and an electron take-off angle of 45° was used for analysis. Each sample was loaded into the UHV chamber and allowed to out-gas for a minimum of 12 hrs until a base pressure of <$1\times10^{-9}$ Torr was reached. The silicon substrate was used as an internal standard for XPS peak positions since the electron escape depth of the X-ray photoelectrons is ~70 Å (for carbon). A binding energy of 99.15 eV was used for elemental silicon.

The parylene polymers have certain unique characteristics, which allow the work here to be undertaken. The parylene polymers via the Gorham process (cyclophane precursors), via p-dihalogenated precursors, or plasma deposition are self-initiating generating the monomer diradical as the active polymerizing species. All three methods of depositing the parylene polymers can be undertaken in vacuum. However, most important is the lack of termination reactions and therefore the parylene polymers contain un-terminated chain ends as-deposited, that contain very active free radicals.

Experimentally, it has been shown that PPXN has a molecular weight approaching $2.5\times10^5$ g/mol by neutron activation analysis via a Wurtz reaction (solution polymerization). It was also shown that with increasing reaction time the molecular weight of the polymer increases, a sensible observation, and important for the present communication. Another study found a molecular weight approaching ~$10^4$ g/mol via the vacuum deposition of PPXC at −196° C. to 0° C. Using electron paramagnetic spectroscopy, an electron spin concentration of $1.2 \times 10^{20}$ spins/g was calculated. In vacuum, the half live of these free radicals was assumed to follow second order kinetics and found to be 157 min. In air, the decay was much more complex and rapid and after several months exposure to air the spin concentration dropped to $5 \times 10^{15}$ spins/g. Oxygen has a difficult time diffusing into the PPXN or PPXC polymers since they are excellent barriers to oxygen and other gases and therefore the surface free radicals react rapidly compared to ones contained in the bulk. PPXN and PPXC have oxygen permeabilities of $33.6 \times 10^{-10}$ and $6.18 \times 10^{-10}$ ($cm^3$-$cm$/$cm^2$-s-Pa) at 25° C. In comparison, poly (styrene) has a permeability of $2000 \times 10^{-10}$ ($cm^3$-$cm$/$cm^2$-s-Pa) at 25° C. towards oxygen. Then the observations that are important to the current work are:

(1) The parylene polymers are un-terminated;

(2) Since the permeability of oxygen into PPXC and PPXN is low, then the surface reaction with chain endings is rapid compared to bulk sites. This is especially true for aqueous solutions.

(3) It is likely that as parylenes film thickness increases its molecular weight correspondingly increases.

XPS spectra of thick PPXN (4752 Å), as-deposited PPXC (15.1 Å) on thick PPXN, the film stack annealed at 200° C. for 60 min at $<10^{-6}$ Torr, and the film stack annealed at 250° C. showed a large O1s peak for the as-deposited PPXC film (15.1 Å) on PPXN. The peak is associated with the reaction between atmospheric oxygen and the PPXC ultrathin film. The PPXC ultrathin film was deposited onto the thick PPXN film only after vacuum was broke so that the thick PPXN film would be become 'passivated' with oxygen according to the proposed reactions below. If the vacuum is not broken than the peak is not present and the spectrum looks identical to the thick PPXN spectrum. The reaction between the ultrathin PPXC film and oxygen is proposed as:

Propagation of the Free-radical

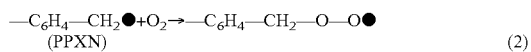

(2)

or

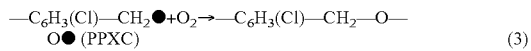

(3)

Reactions (2) or (3) were previously proposed by Gazicki et al. These surfaces are considered 'passivated' since they are significantly less reactive than without oxygen.

Termination of the Free-radical at Room-temperature (Sluggish)

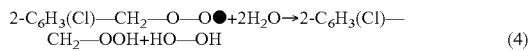

(4)

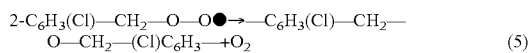

(5)

Termination of the Free-radical at Elevated Temperatures Forming High Polymer

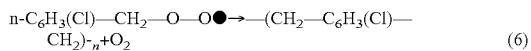

(6)

When the stack (15.1 Å PPXC on thick PPXN) is annealed at 200° C. the oxygen signal is largely reduced and at 250° C. eliminated entirely. Since both of these films originally contained much oxygen like the as-deposited stack than the post-deposition anneal eliminated oxygen from the PPXC surface. The oxygen then should be bonded weakly to the surface as in reactions (2) and (3). Once annealed, the surface is largely un-reactive towards $(NH_4)_2S_{(aq)}$ suggesting that a loss of free radical species results and high polymer is formed as in reaction (6).

Two sets of films were grown on a RCA-1 (5:1:1 DI-$H_2O$: $NH_4OH$:$H_2O_2$ at 70° C. for 2 min) cleaned native oxide on silicon. The ultrathin (32.6 Å) and thick (2519 Å) PPXN films were exposed to 50 wt % $(NH_4)_2S_{(aq)}$ solution for 5, 15, and 30 min. Aqueous ammonium sulfide has been previously proposed as a buffered source of ammonium hydroxide at a pH=9.5. The thick film showed little change in its contact angle (with respect to DI-$H_2O$), however, the un-annealed ultrathin film exhibited a precipitous drop in its contact angle even after 5 min exposure. Another film of the same thickness was annealed for 350° C. for 60 min at $<10^{-6}$ Torr to ensure that the film did not debond from the native oxide surface and the effect was real. The annealed film showed a slight drop in its contact angle due to either its thickness loss or its changing surface roughness. The film's thickness was 26% less than its original value, however, the contact angle only dropped slightly and gradually much like the thick parylene film. The reduced thickness can also be seen in the Cl2p XPS spectra. The Cl/C ratio for the 200° C. and 250° C. annealed films is reduced by a similar degree as the PPXN ultrathin films on $SiO_2$ annealed at 350° C., indicating that some mass loss took place from the annealed ultrathin films. Also, the integrated area of the as-deposited PPXC film on PPXN and on $SiO_2$ is the same, even though it is a less reliable method then calculating the ratios between different elements.

The un-annealed PPXC ultrathin films exhibit a Cl $2p_{3/2}$ peak at 200.8 eV slightly shifted from 200.5-200.6 eV for the annealed films. The spin orbital splitting between the Cl $2p_{3/2}$ and Cl $2p_{1/2}$ peaks is 1.6 eV and represents literature value. This slight shift maybe due to the presence of oxygen at the chain ends. Further, these binding energies are slightly higher then what has been previously reported for polyvinylchloride, at 200.0 eV for the Cl $2p_{3/2}$ peak. The 15.1 Å PPXC thin film on $SiO_2$ exhibited two peaks in its C1s XPS spectrum. The spectrum is calibrated with respect to Si at 99.15 eV. The primary peak at 285.1 eV is attributed to C—C bonding, whereas the peak at 286.6 eV is attributed to C—O bonding from the oxygen end-capped oligomer. The relative percent C—O bonding, based on the integrated areas, is 20% and is significantly more then what would be expected for adventitious carbon or the thick PPXN thin films, <1%.

From the data presented, it is proposed that ultrathin films are oligomeric and therefore have a high percentage of end-groups compared to thick or high polymer films (~$10^5$ g/mol). The end groups at the surface are reactive not only towards atmospheric oxygen but to chemicals such as ammonium sulfide, that can functionalize the surface with hydroxyl groups. These groups in turn can lower the contact angle of the polymer surface with respect to water. Once the polymer surface is functionalized then it is available for further reactions with, for example, self-assembled monolayers.

The parylene polymers are commonly deposited in vacuum by a unique method where the polymerizatio is self-initiating and un-terminating. The lack of termination reactions allows the polymers to possess un-terminated chain-ends that are reactive towards atmospheric oxygen and common organic reagents. However, such reactions have not been observed with thick, >1000 Å, parylene films due to their high molecular weight. As a result, few chain-ends reside at the polymer surface to be available for further reaction and therefore no O1s XPS peak is observed. However, when ultrathin, 15-32 Å, parylene films were deposited onto thick parylene films (2520-4750 Å) a rather large O1s peak was observed. However, this peak was only observed when vacuum was broke between depositing the thick film and the ultrathin film. The same stack that was annealed in high vacuum (<$10^{-6}$ Torr) at 200° C. exhibited a reduced O1s peak that disappeared completely after a 250° C. anneal. Therefore, the oxygen bonded to the parylene chain-ends is thermally labile indicative of perhaps peroxide bonding.

The ultrathin films were also exposed to 50 wt % ammonium sulfide for 5, 15, and 30 min. The un-annealed ultrathin film exhibited a large reduction in its contact angle; however, this was unlike the same film that was annealed at 350° C. in high vacuum. That film, like the thick un-annealed parylene film, showed only a modest decline in its contact angle as a function of exposure time. Most important, once the polymer is functionalized it can further react with other organics, e.g. self-assembled monolayers, or more important, its surface chemistry can be easily controlled to improve adhesion to other dielectrics or metals.

The invention claimed is:

1. A method for forming a metallized layer on a substrate, said method comprising:

depositing on a substrate by a thermal CVD process an ultrathin layer having a thickness of less than 500 Å and comprising a polymer having repeating units derived from unsubstituted p-xylylene, substituted p-xylylene, phenylene vinylene, phenylene ethynylene, 1,4-methylene naphthalene, 2,6-methylene naphthalene, 1,4-vinylene naphthalene, 2,6-vinylene naphthalene, 1,4-ethynylene naphthalene, 2,6-ethynylene naphthalene, or combinations thereof;

exposing the ultrathin layer to a source of oxygen; and depositing a metal layer comprising Be, B, Mg, Al, Si, Ti, V, Cr, Mn, Fe, Co, Ni, Zr, Nb, Ta or a combination thereof directly on the ultrathin layer.

2. A method according to claim 1, additionally comprising, before depositing the metal layer, exposing the ultrathin layer to a reagent selected from ammonium hydroxide, tetramethylammonium hydroxide, ammonium sulfide, dimethyl sulfide, thioacetic acid, sodium hydrosulfide, sodium sulfide, hydrazine and acetamide, whereby hydroxyl, amino, thio groups, or a combination thereof, are attached to the surface of the ultrathin layer.

3. A method according to claim 1, wherein the metal layer comprises Al, Ti, Cr, or Ta.

4. A method according to claim 1, wherein the metal layer comprises Ti.

* * * * *